(12) United States Patent
Goyal et al.

(10) Patent No.: US 7,284,211 B2
(45) Date of Patent: Oct. 16, 2007

(54) EXTENSIBLE IO TESTING IMPLEMENTATION

(75) Inventors: Saket K. Goyal, Milpitas, CA (US); Hunaid Hussain, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 613 days.

(21) Appl. No.: 10/417,007

(22) Filed: Apr. 16, 2003

(65) Prior Publication Data

US 2004/0221197 A1 Nov. 4, 2004

(51) Int. Cl.
*G06F 17/50* (2006.01)
(52) U.S. Cl. .............................................. 716/4; 716/5
(58) Field of Classification Search .................... 716/4, 716/5, 18; 714/25
See application file for complete search history.

(56) References Cited

U.S. PATENT DOCUMENTS

| | | | |
|---|---|---|---|
| 4,749,947 A * | 6/1988 | Gheewala | .................... 714/734 |
| 6,499,125 B1 | 12/2002 | Ohta et al. | |
| 6,557,153 B1 | 4/2003 | Dahl et al. | |
| 6,564,363 B1 | 5/2003 | Dahl et al. | |
| 6,678,875 B2 | 1/2004 | Pajak et al. | |
| 6,708,144 B1 * | 3/2004 | Merryman et al. | ........... 703/14 |
| 6,836,872 B2 | 12/2004 | Abdennadher | |

* cited by examiner

*Primary Examiner*—Sun James Lin
(74) *Attorney, Agent, or Firm*—Trexler, Bushnell, Giangorgi, Blackstone, & Marr, Ltd.

(57) ABSTRACT

A library useable to facilitate testing of IO cells of an ASIC. The library includes IO cell identifications and test structures associated with the IO cell identifications, and identifies which test structures are required to test which IO cells. Preferably, the library forms part of an ASIC design system. A method of testing IO cells of an ASIC is also provided, and includes using the library to determine which test structures to use to test the IO cells, and testing the IO cells using the test structures.

14 Claims, 3 Drawing Sheets

Method

EXTENSIBLE IO TESTING IMPLEMENTATION

COPYRIGHT NOTICE

A portion of the disclosure of this patent application contains material which is subject to copyright protection. The copyright owner has no objection to the facsimile reproduction by anyone of the patent document or the patent disclosure, as it appears in the United States Patent and Trademark Office patent file or records, but otherwise reserves all copyright rights whatsoever.

BACKGROUND OF THE INVENTION

The present invention relates generally to application-specific integrated circuit (ASIC) design. More specifically, but without limitation thereto, the present invention relates to methods and systems for testing Input/Output (IO) cells used in application-specific integrated circuit (ASIC) design.

A variety of IO cells are used in ASIC's. The functionality of these cells is increasing as the process geometries of these cells is decreasing. When these cells are used in ASIC, it would be desirable to test these IO cells on an ASIC tester. In order to test these IO cells on an ASIC tester, though, oftentimes additional logic is needed (i.e., surrounding the IO cells). The number of cells (in variety) which require extra logic to test them is increasing. Also, the logic required to test IO cells is different for different types of IO cells.

Basically, at the present time, there is no standard way or automated way to test IO cells in an ASIC design, and when IO cells are tested, it is done manually. Manually testing IO cells is generally difficult, time consuming and prone to errors. Oftentimes, designers are under time pressures to meet deadlines. As a result of there being no standard way or automated way to test IO cells, the fact that manual testing is so difficult, time consuming and prone to errors, and the fact that ASIC designers are often under time pressure, designers often skip (either entirely or partially) the step of testing the IO cells, and the IO cells go untested or perhaps only partially tested. As a result, parts in the ASIC may fail. Even if the IO cells are tested, they are typically tested manually. As a result, different testing variations may be attempted, and this usually makes it difficult to debug a problem in case of failure.

LSI Logic, the Assignee of the present invention, provides a design system called "FlexStream" (which is a registered trademark of LSI Logic (all rights reserved)). As shown in FIG. 1, the FlexStream® design system is configured such that an ASIC designer uses certain third party tools (i.e., implementation, verification and manufacturing test tools) to design an ASIC, and uses LSI Logic's FlexStream® design system to analyze the design. The FlexStream® design system is a fully integrated environment for complex ASIC and System-on-a-Chip (SoC) design. It provides a complete system-to-silicon methodology that enables first-pass silicon success to meet tight time-to-market windows. The FlexStream® design system is an integration of best-in-class LSI Logic and third party EDA tools. This approach provides an ASIC designer with the flexibility to use their preferred tools. The ASIC designer designs with efficiency and confidence because LSI Logic's strong partnerships with EDA vendors assure that third party tools are well-integrated into the FlexStream® environment. In addition to design capabilities, the FlexStream® design system provides a link between all the design components—process technology, libraries and memories, CoreWare functions, advanced packaging solutions, and manufacturing, test, and assembly. While the FlexStream® design system which is currently available provides many advantages, it does not define a system or provide the necessary guidelines or information needed to effectively test the IO cells of an ASIC.

OBJECTS AND SUMMARY

An object of an embodiment of the invention is to provide a library which can be used to test the IO cells of an ASIC.

Another object of an embodiment of the invention is to provide a library which contains data which identifies IO cells which should be used for testing.

Still another object of an embodiment of the invention is to provide a library which contains data which identifies pins of IO cells which should be assigned constant values during testing.

Yet another object of an embodiment of the invention is to provide a library which contains data which identifies which IO cells can be shared with test pins during testing.

Still yet another object of an embodiment of the invention is to provide a library which contains data which identifies which bidirectional IO cells can be used as only an input or an output during testing.

A further object of an embodiment of the invention is to provide a library which contains data which identifies pin level and cell level properties.

A still further object of an embodiment of the invention is to provide a library which contains data which identifies which pins need test control during testing.

Briefly, and in accordance with at least one of the foregoing objects, an embodiment of the present invention provides a library which is useable to facilitate testing of IO cells of an ASIC. The library includes IO cell identifications and test structures associated with the IO cell identifications. The library contains data which identifies which test structures are required to test which IO cells. Preferably, the library forms part of an ASIC design system or tester.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which.

DESCRIPTION

Figure 1:
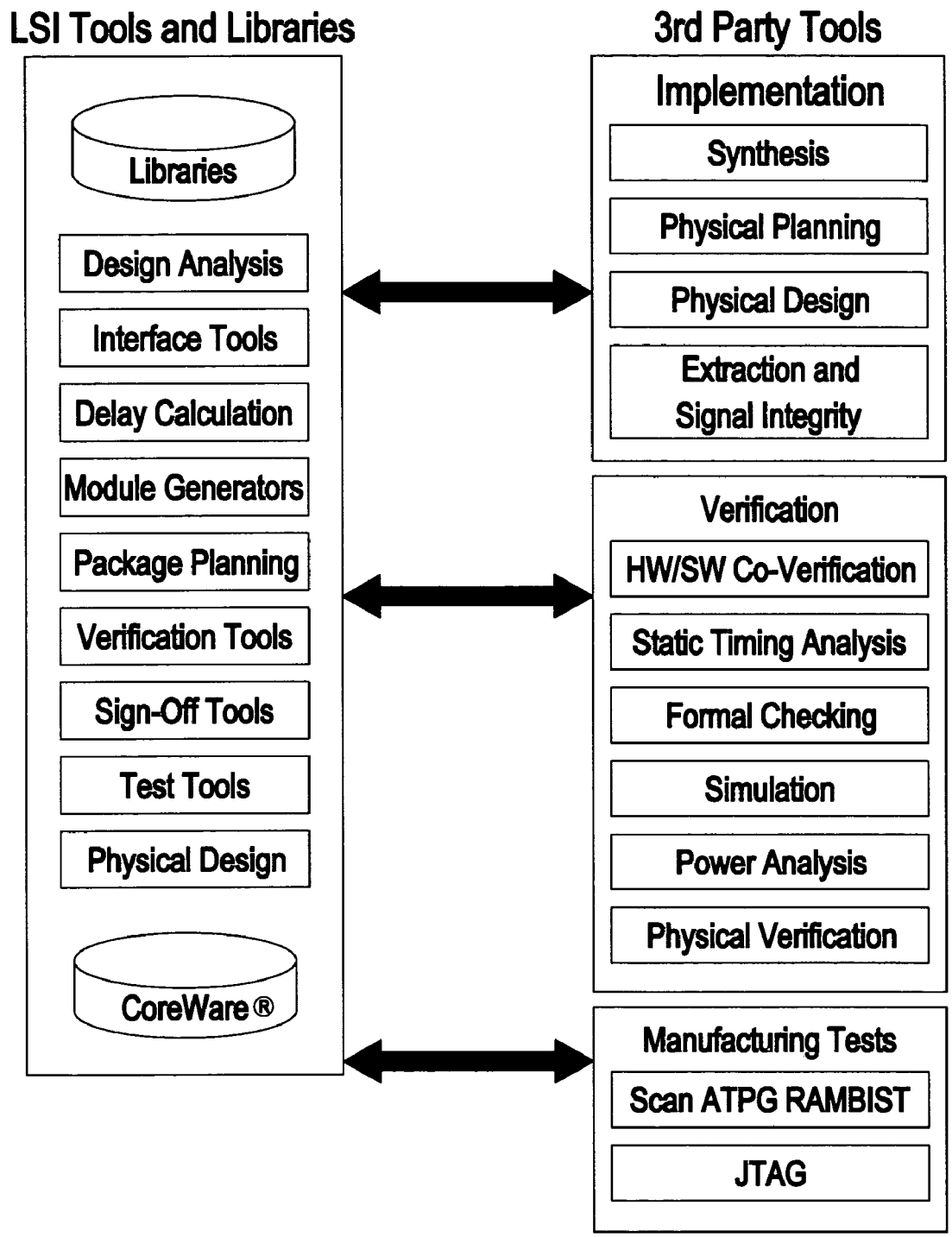
FIG. 1 illustrates LSI Logic's FlexStream® design system and its association with third party tools.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated and described herein.

Figure 2:
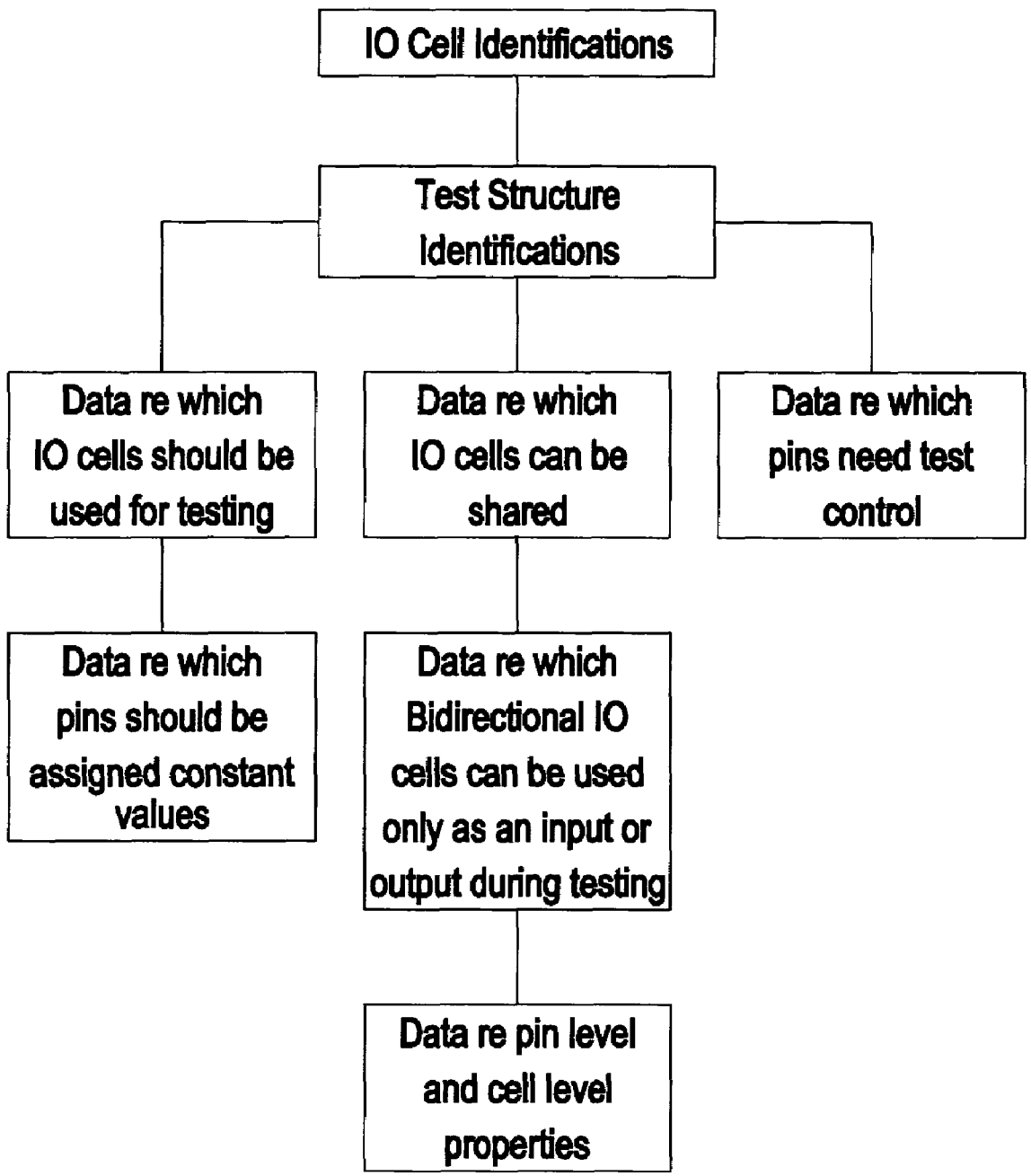
FIG. 2 illustrates a library which is in accordance with an embodiment of the present invention.

An embodiment of the present invention is illustrated in FIG. 2. As shown, the embodiment provides a library which includes IO cell identifications (and IO cell family identifications) and test structures associated with the IO cell identifications (and IO cell family identifications), wherein the library contains data which identifies which test structures should be used to test the IO cells (and IO cell families). Preferably, the library contains data which identifies IO cells which should be used for testing, data which identifies pins of IO cells which should be assigned constant values during testing, data which identifies which IO cells can be shared with test pins during testing, data which identifies which bidirectional IO cells can be used as only an input or an output during testing, data which identifies pin level and cell level properties, and data which identifies which pins need test control during testing.

The library may contain still additional data, such as data which indicates whether any of the IO cells need test control, and if so, what kind of rules should be followed while adding the test control. For example,

```
add_cell -name lvdsbiascore -type LVDSBIASCOREXLS33 -connect {
    VSW1    net_u_athena3_hcm_srv_lvds_ictrl[1]
    VSW0    net_u_athena3_hcm_srv_lvds_ictrl[0]
    TERM    1
    TERMEN  0
    PD      net_u_athena3_hcm_power_down
}
```

In such case, pins VSW1, VSW0, TERM, TERMEN, PD need to have test control.

The library may also contain if commands to control those pins which are not present in an IO cell definition file. The library may also contain data which indicates which IO cells require special handling in terms of test automation and pattern generation, and data which indicates whether a cell needs special processing for a third party. This is generally because of the fact that a workaround is needed to overcome a third party tool limitation or bug.

As discussed above, preferably the library contains pin level and cell level properties, for example:

```
Cell (<cellName>) {
    Property1 : Value 1;
    Property2 : Value 2;
    Property3 : Value 3;
    PIN (<pinName>) {
        PinProperty1 : Pin Value1;
        PinProperty2 : Pin Value2;
        PinProperty3 : Pin Value3;
    }
    PIN (<pinName>) {
    }
}
Cell (<cellName>) {
    Property1 : Value1;
    Property2 : Value2;
    Property3 : Value3;
    PIN (<pinName>) {
        PinProperty1 : Pin Value1;
        PinProperty2 : Pin Value2;
        PinProperty3 : Pin Value3;
    }
    PIN (<pinName>) {
    }
}
```

The properties present at pin and/or cell level preferably have no restriction as what can be contained therein. The interpretation of the properties is preferably implemented by an application which needs the property. Preferably, there is a Tcl Parser and API associated with the library, where the application can access the properties using the API. The library may be initially generated by hand and/or through some scripts by test methodology group. This is because they have better understanding of each IO cell with regard to the manufacturing test. Subsequently, the library can be merged with, or automatically generated from, technology libraries.

Preferably, the library is provided within a design system. For example, it may be provided as a library in LSI Logic's FlexStream® design system (see FIG. 1). Further, preferably such a library is provided for each main technology. Here is an example:

```
Technology(gflx) {
    ## global PD and PDN and RPDN
    ## PD=0 and PDN=1 and RPDN=1 for all the test instructions.
    user_power_down_mux_ir_instr_list: SCAN;
    user_power_down_mux_select_ir_instr_list:
    SCAN, BZ, PLL, IDDQ, LBRAM_SCAN,
        SCAN_BISR_FUSE_WAFER_SORT,
        EXTEST, SAMPLE, PRELOAD, HIGHZ;
    user_power_down_can_combine: true;
    user_power_down_mux_required: true;
    Cell (BDZSSTL9DDRJLS25) {
        PIN (MODE) {
            type: mode;
            can_combine: true;
            mux_required: true;
            mux_ir_instr_list: SCAN, BZ, PLL;
            mux_select_ir_instr_list: SCAN, BZ, PLL;
        }
    }
}
```

Figure 3:
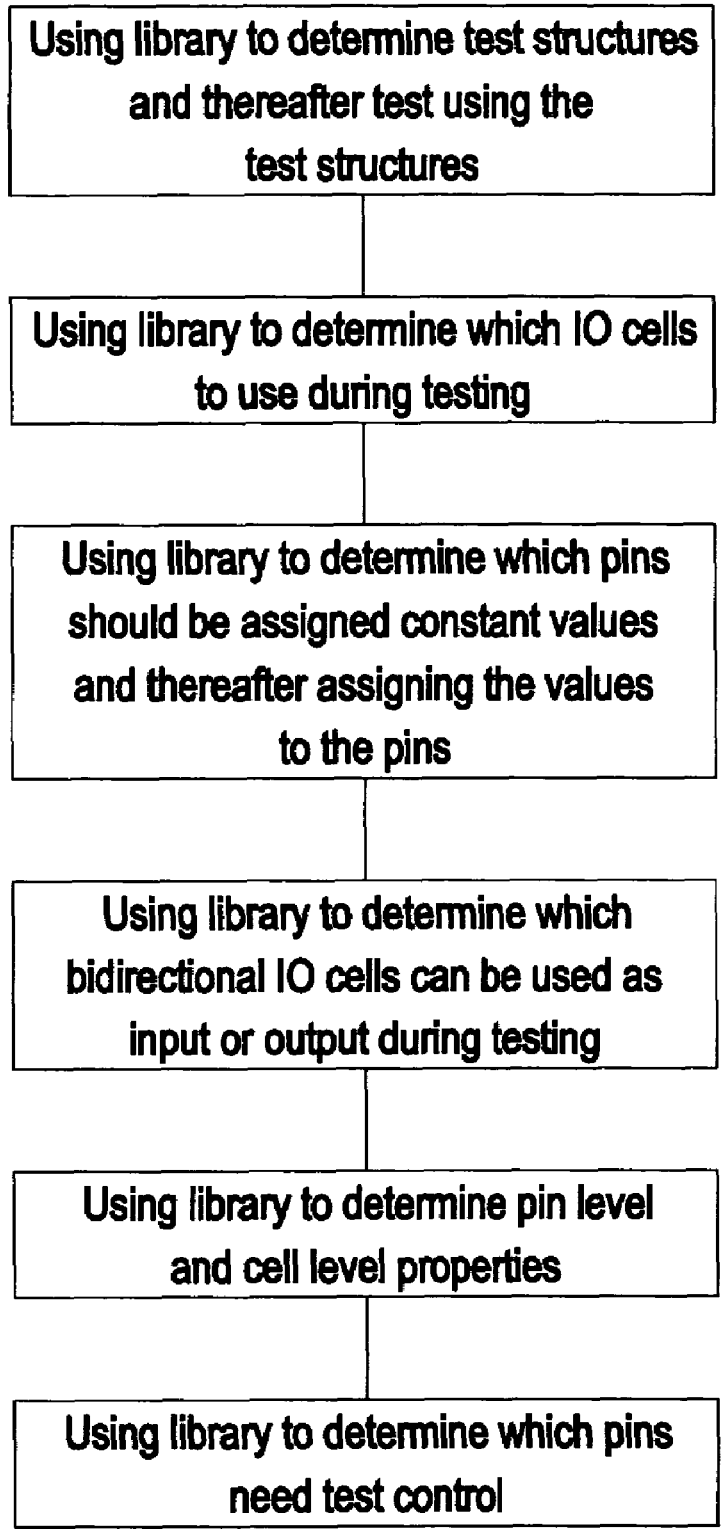
FIG. 3 illustrates a method which is in accordance with an embodiment of the present invention.

A method in accordance with an embodiment of the present invention is illustrated in FIG. 3 and includes reading the library (illustrated in FIG. 2) in. The library is used to determine which test structures to use to test the IO cells, and the specified test structures are inserted to make IO cell testing standard and predictable for all designs. Then, consistent with the content of the library, the method includes using the library to determine which IO cells should be used for testing, to determine which pins of IO cells should be assigned constant values during testing (and thereafter assigning the pins constant values during testing), to determine which IO cells can be shared for test pins during testing, to determine which bidirectional IO cells can be used as only an input or an output during testing, to determine both pin level and cell level properties, as well as to determine which pins need test control during testing.

Preferably, the implementation is independent of the fact that new IO cells have been introduced, and is completely seamless for the automation. Preferably, the library is updated to include new IO cells and new IO cell families and define how they need to be tested. Preferably, the library allows any IO cell to be tested in a variety of ways and specifies how IO cells can be tested in a variety of test patterns.

Preferably, the library provides standard test logic for all IO cells used in an ASIC design, provides that any new IO cell can be easily added to specify how a cell is supposed to be tested in a variety of ways, provides that any third party IO cell (and associated data) can be added to the library in the same way that an internal cell would be specified, provides that debugging is easy in case of failures, and provides for easy automation.

Another embodiment of the present invention provides a way for ASIC designers to add their own custom test structures and be able to test them in existing test framework. Also, this provides a flexible way to combine different or same test pins together for sharing with a common functional port for testing purposes. Also, this allows the ASIC designer to change the way a certain structure is being controlled in test mode. Preferably, this embodiment greatly decreases the amount of time dedicated to development and verification for any new standard test structure or any custom test structures being added.

Preferably, this is implemented in such a way so that all the different types of control information for test pins, how different and same test pins can be combined, what kind of ports cannot be shared for certain test pins in the form of a library which is built into a software tool which is configured to minimize time scales and project risk, check RTL code and generate synthesis scripts to minimize timing/area/power and optimize for the technology. The same part of that library can be overwritten or new data can be added when a tool is being run. This allows ASIC designers to override or add new information in this file. For each type of test pin, approximately five to ten lines of text needs to be added in the format of this file.

Salient features of this embodiment include: it makes it easy to add new structures for testing, it makes it easy to change controls and some other definitions of existing test structures, no amount of development is required for new test structures, how different and same kinds of pins can be combined is easy to specify and optimize the number of functional ports for sharing test pins, it makes it easy to add custom test structures in existing framework, the amount of time otherwise spent in verification is shifted in case of custom test structures. By adding new lines of code in the library format, one can implement new structures in the matter of minutes, as compared to months of development time. This greatly reduces the development time.

While a preferred embodiment of the present invention is shown and described, it is envisioned that those skilled in the art may devise various modifications of the present invention without departing from the spirit and scope of the appended claims.

The invention is claimed as follows:

1. A method of testing IO cells of an ASIC, said method comprising using a library to determine, based on IO cell identifications contained in the library, which test structures identified in the library and associated with the IO cell identifications contained in the library are to be used to test the IO cells; and testing the IO cells using the determined test structures.

2. The method as defined in claim 1, further comprising using said library to determine which IO cells should not be used for testing.

3. The method as defined in claim 1, further comprising using said library to determine which pins of IO cells should be assigned constant values during testing and assigning the pins constant values during testing.

4. The method as defined in claim 1, further comprising using said library to determine which IO cells can be shared for test pins during testing.

5. The method as defined in claim 1, further comprising using said library to determine which bidirectional IO cells can be used as only an input or an output during testing.

6. The method as defined in claim 1, further comprising using said library to determine pin level and cell level properties.

7. The method as defined in claim 1, further comprising using said library to determine which pins need test control during testing.

8. An ASIC design system comprising a library which is useable to facilitate testing of IO cells of an ASIC, said library comprising IO cell identifications and test structures associated with the IO cell identifications, wherein said library contains data which identifies, based on the IO cell identifications contained in the library, which test structures identified in the library and associated with the IO cell identifications contained in the library should be used to test the IO cells.

9. The ASIC design system as defined in claim 8, wherein said library contains data which identifies IO cells which should be used for testing.

10. The ASIC design system as defined in claim 8, wherein said library contains data which identifies pins of IO cells which should be assigned constant values during testing.

11. The ASIC design system as defined in claim 8, wherein said library contains data which identifies which IO cells can be shared for test pins during testing.

12. The ASIC design system as defined in claim 8, wherein said library contains data which identifies which bidirectional IO cells can be used as only an input or an output during testing.

13. The ASIC design system as defined in claim 8, wherein said library contains data which identifies pin level and cell level properties.

14. The ASIC design system as defined in claim 8, wherein said library contains data which identifies which pins need test control during testing.

* * * * *